(12) United States Patent
Ghoshal

(10) Patent No.: US 6,204,165 B1
(45) Date of Patent: Mar. 20, 2001

(54) PRACTICAL AIR DIELECTRIC INTERCONNECTIONS BY POST-PROCESSING STANDARD CMOS WAFERS

(75) Inventor: Uttam Shyamalindu Ghoshal, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/339,705

(22) Filed: Jun. 24, 1999

(51) Int. Cl.[7] .................. H01L 21/44; H01L 21/4763
(52) U.S. Cl. .................. 438/619; 438/624; 438/633; 438/634; 257/276
(58) Field of Search .................. 438/619, 622, 438/623, 624, 625, 627, 633, 634, 637, 691; 257/522, 758, 276

(56) References Cited

U.S. PATENT DOCUMENTS

| 5,530,290 | 6/1996 | Aitken et al. ............ 257/758 |
| 5,798,559 | 8/1998 | Bothra et al. ............ 257/522 |
| 6,017,814 | * | 1/2000 | Grill et al. ............ 438/619 |
| 6,057,224 | * | 1/2000 | Bothra et al. ............ 438/619 |
| 6,060,381 | * | 5/2000 | Nakagawara et al. ............ 438/619 |

OTHER PUBLICATIONS

Shieh et al.; Integration and Reliability Issues For Low Capacitance Air–Gap Interconnect Structures; pp. 98–125—98–127.

* cited by examiner

Primary Examiner—Charles Bowers
Assistant Examiner—Thanhha Pham
(74) Attorney, Agent, or Firm—Casimer K. Salys; Duke W. Yee

(57) ABSTRACT

A method of fabricating an integrated circuit having air-gaps between interconnect levels. In a preferred embodiment, an integrated circuit is partially fabricated. The partially fabricated integrated circuit includes a top layer, interconnect structures having a cladding layer, dielectric layers and an etch stop layer resistant to certain first types of etchants. The top layer of the integrated circuit is etched with a second type of etchant. The dielectric layers are then etched with one of the first types of etchants until the etch stop layer is reached. Thus, portions of the interconnect structures are exposed to create interconnect islands surrounded by air. A cover is mechanically placed over the exposed interconnect islands to protect the integrated circuit from dust particles.

16 Claims, 10 Drawing Sheets

PRACTICAL AIR DIELECTRIC INTERCONNECTIONS BY POST-PROCESSING STANDARD CMOS WAFERS

BACKGROUND OF THE INVENTION

1. Technical Field

The present invention relates to the area of semiconductors and semiconductor processing and more particularly to methods and structures that provide low dielectric constant interconnects for integrated circuits.

2. Description of Related Art

Interconnect structures of integrated circuits (ICs) generally take the form of patterned metallization lines that are used to electrically interconnect devices and to provide interconnection with external circuitry. By way of example, IC devices may include metal oxide semiconductor ("MOS") devices having diffused source and drain regions separated by channel regions, and gates located over the channel regions. In practice, an IC chip may include thousands or millions of devices such as MOS transistors.

Conventionally, a dielectric layer is deposited over the devices and via holes are formed through the dielectric layer to the devices below. After the via holes are etched through the dielectric layer, a metallization layer is deposited over the dielectric surface filling the via holes with metal vias. After the first metallization layer has been deposited, it is patterned to form interconnect metallization lines. AS is well known in the art, "patterning" may be accomplished by depositing a photoresist layer, selectively exposing the photoresist to light, developing the photoresist to form an etch mask, and etching the exposed metallization to pattern the metallization layer, and removing the etch mask. This process may then be repeated if additional layers of metallization lines are desired.

As IC technology scales, the performance of ultra large scale integrated (ULSI) chips is increasingly limited by the capacitance of the interconnects. The capacitance of the interconnects contributes to RC delay, AC power ($CV^2f$) dissipation, and cross-talk. The use of air-gaps formed between metal lines during $SiO_2$ deposition has been shown to reduce the capacitance of tightly spaced interconnects by as much as 40% compared to homogeneous $SiO_2$ (see Shieh, B., et al., *IEEE Electron Device Letters.*, 19, no. 1, pp. 16–18.). This capacitance reduction is better than the reduction obtained using low-k materials such as polymers in a homogeneous scheme.

However, significant problems exist with present methods of forming air-gaps between interconnects. Many existing methods are specific only to Al or AlCu interconnects (see U.S. Pat. No. 5,798,559 issued to Bothra et al.) or require the development of new backend processes (see U.S. Pat Nos. 5,798,559 issued to Bothra et al. and 5,530,290 issued to Aitken et al.). Other methods of introducing air-gaps between interconnects are not compatible with chemical mechanical polishing (CMP) processes in multilevel interconnect systems because those methods can trap slurry in the gaps (see Shieh, B. P., et al., "Integration and Reliability Issues for Low Capacitance Air-Gap Interconnect Structures," Proceedings of the International Interconnect Technology Conference, San Francisco, pp. 125–27, June 1998).

Therefore, it would be advantageous to have a method of introducing air-gaps between interconnects that does not require the development of new backend processes, that is compatible with many types of interconnect metals, and is compatible with CMP processes in multilevel interconnect systems.

SUMMARY OF THE INVENTION

The present invention provides a method of fabricating an integrated circuit having air-gaps between interconnect levels. In a preferred embodiment, an integrated circuit is partially fabricated. The partially fabricated integrated circuit includes a top layer, interconnect structures having a cladding layer, dielectric layers, and an etch stop layer resistant to certain first types of etchants. The top layer of the integrated circuit is etched with a second type of etchant. The dielectric layers are then etched with one of the first types of etchants until the etch stop layer is reached. Thus, portions of the interconnect structures are exposed to create interconnect islands surrounded by air. A cover is mechanically placed over the exposed interconnect islands to protect the integrated circuit from dust particles.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
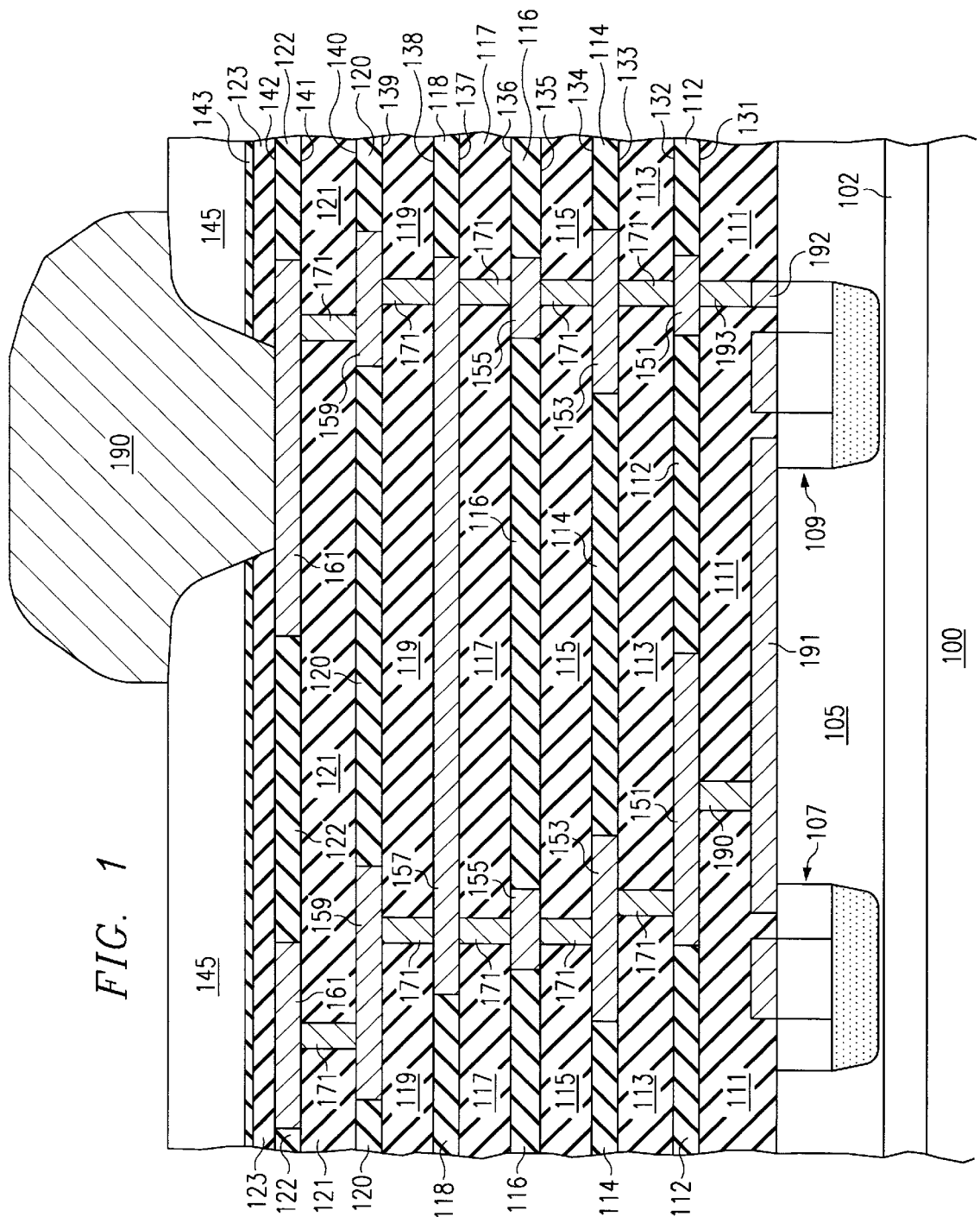
FIG. 1 depicts an SOI CMOS device with cladded copper interconnects.

The processes, steps, and structures described below do not form a complete process flow for manufacturing integrated circuits. The present invention can be practiced in conjunction with integrated circuit fabrication techniques currently used in the art, and only so much of the commonly practiced process steps are included as necessary for an understanding of the present invention. The figures represent cross sections of a portion of an integrated circuit during fabrication and are not drawn to scale, but instead are drawn so as to illustrate important features of the invention.

The present invention provides for the creation of air dielectric interconnections by post-processing standard CMOS wafers using advanced etching techniques popular in micromachining literature. However, the process may be applied to most interconnection systems for other devices such as bipolar transistors, bulk CMOS, and DRAM memory cells to name but a few. An example of a standard CMOS wafer is depicted in cross section view in FIG. 1. In this particular example, an SOI CMOS wafer 100 is depicted. Wafer 100 has a buried oxide layer 105 formed over a silicon substrate 102. Silicon-on-insulator ("SOI") transistors 107 and 109 have been formed in buried oxide layer 105 as shown. Local interconnections have been formed from layers of tungsten metallization 190, 191, 192, and 193. Dielectric layers 111, 112, 113, 114, 115, 116, 117, 118, 119, 120, 121, 122 and 123 separated by thin silicon nitride layers 131, 132, 133, 134, 135, 36, 137, 138, 139, 140, 141, and 142 have been formed over the SOI transistors 107 and 109. Interconnects 151, 153, 155, 157, 159, and 161 provide connections to various devices at different levels in the wafer 100. A thick nitride layer 143 has been formed over dielectric layer 123. A polyimide layer 145 covers thick nitride layer 143. A C4 flip-chip solder 190 has been processed on the active substrate as shown. Typically flip-chip solder 190 is a lead/tin ("Pb/Sn") solder over nickel ("Ni") plated copper ("Cu"). However, various kinds of solders can be used depending on the Indium ("In") and bismuth ("Bi") content.

In the present example, dielectric layers 111, 112, 113, 114, 115, 116, 117, 118, 119, 120, 121, 122 and 123 are silicon oxide. However, other dielectrics may be used in place of silicon oxide as will be obvious to one skilled in the appropriate art. Examples of other dielectrics include but are not limited to fluorinated silicon dioxide, spun-on glass ("SOG"), and silicon dioxide/polymers.

The interconnections 151, 153, 155, 157, 159, and 161 in the present example are copper. However, other metals can be used for these interconnects as will be obvious to one skilled in the art. The copper interconnections 151, 153, 155, 157, 159, and 161 include a cladding layer (not shown) that acts as a chemical barrier layer between the copper and the silicon oxide. Electrical connections 171 between interconnections 151, 153, 155, 157, 159 and 161 are typically constructed of the same material as interconnections 151, 153, 155, 157, 159, and 161, which in this case is copper. Thin silicon nitride layers 131, 132, 133, 134, 135, 136, 137, 138, 139, 140, 141, and 142 have been formed as a result of the dual-damascene copper electroplating process, which is described in further detail below.

For CMOS wafer 100 given as an example, interconnections 159 and 161 as well as dielectric layers 119, 120, 121, and 122 are typically between 0.3 microns and 3 microns thick. Thin silicon nitride layers 131, 132, 133, 134, 135, 136, 137, 138, 139, 140, 141, and 142 are typically around 0.1 microns thick. Silicon nitride layer 143 is typically about 0.3 microns thick. Polyimide layer 145 is typically about 3 microns thick. Dielectric layer 123 is typically around 0.5 microns thick. Metallization layers 151, 153, 155, and 157 and dielectric layers 112, 113, 114, 115, 116, 117, and 118 are typically around 0.5 microns thick. These dimensions are given merely as examples of appropriate thickness for the layers used in wafer 100 which is given merely as an example of a wafer. Other dimensions appropriate for other examples will be obvious to one skilled in the art.

FIGS. 2A–2D illustrate the dual-damascene copper electroplating process used in forming each of interconnections 151, 153, 155, 157, 159, and 161 illustrated in FIG. 1. The dual-damascene copper electroplating process is merely exemplary of a process for forming interconnections and other processes for achieving the same result will be obvious to one skilled in the art. Furthermore, other conductors other than copper may be used. Copper is merely shown as an example.

Figure 2A:
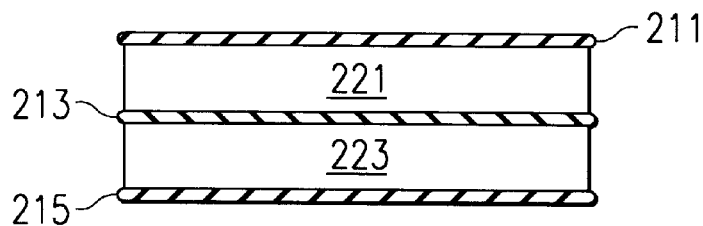
FIGS. 2A–2D depicts different phases of a dual-damascene process.
Figure 2B:
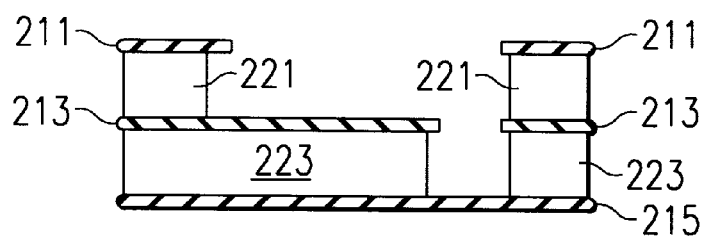
Figure 2C:
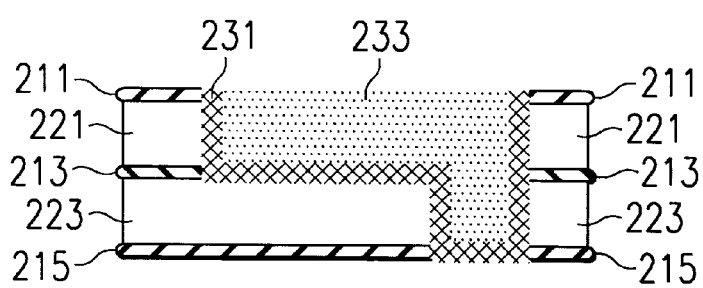
Figure 2D:
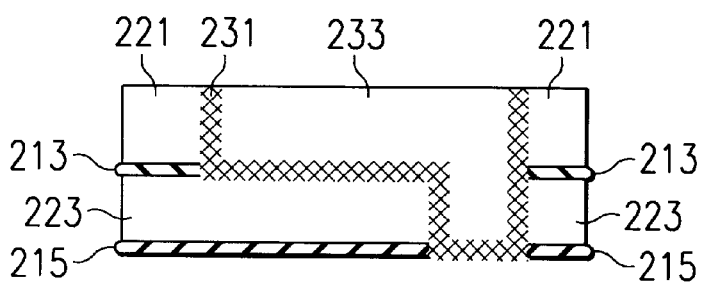

FIG. 2A shows a cross-section of a portion of a wafer with silicon nitride layers 211, 213, and 215 separated by silicon oxide layers 221 and 223. Line and via definition are etched into nitride layers 211, 213, and 215 and oxide layers 221 and 223 as depicted in FIG. 2B. Barrier layer 231 and seed layer 233 are formed as depicted in FIG. 2C. Typical barrier layer 231 materials are TiN/Ti, Tantalum ("Ta"), or electro-less Cobalt ("Co"). Typical seed layers 233 include thin sputtered copper ("Cu") or chemical vapor deposition ("CVD") Cu. More detail regarding the dual-damascene process is described in C.-K. Hu and J. M. E. Harper, "Copper Interconnections and Reliability," Mater. Chem. Phys. vol. 52, pp. 5–12, 1998, which is hereby incorporated by reference. Finally, chemical mechanical polishing ("CMP") is performed to planarize the surface of the interconnect. The result of the CMP is depicted in FIG. 2D.

Figure 3:
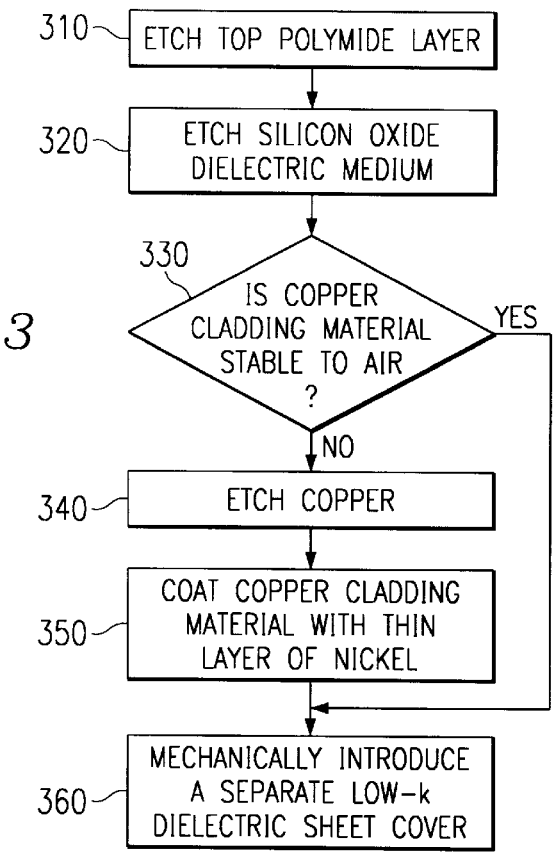
FIG. 3 depicts a flow chart of a preferred embodiment of the preset invention.
Figure 4A:
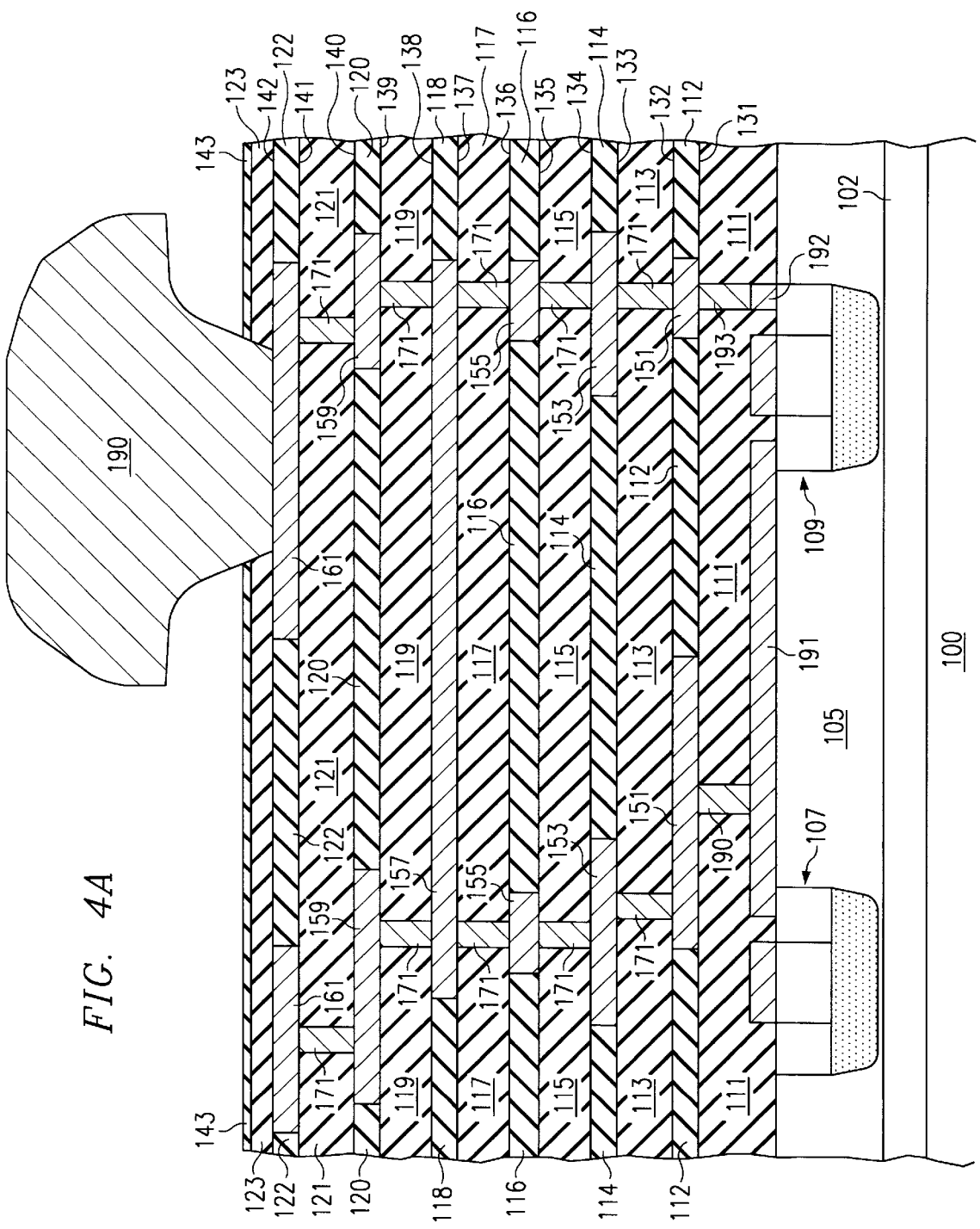
FIGS. 4A–4G depicts a SOI CMOS device, in cross sectional view, during various stages of the process for creating air-gaps-in accordance with the present invention.
Figure 4B:
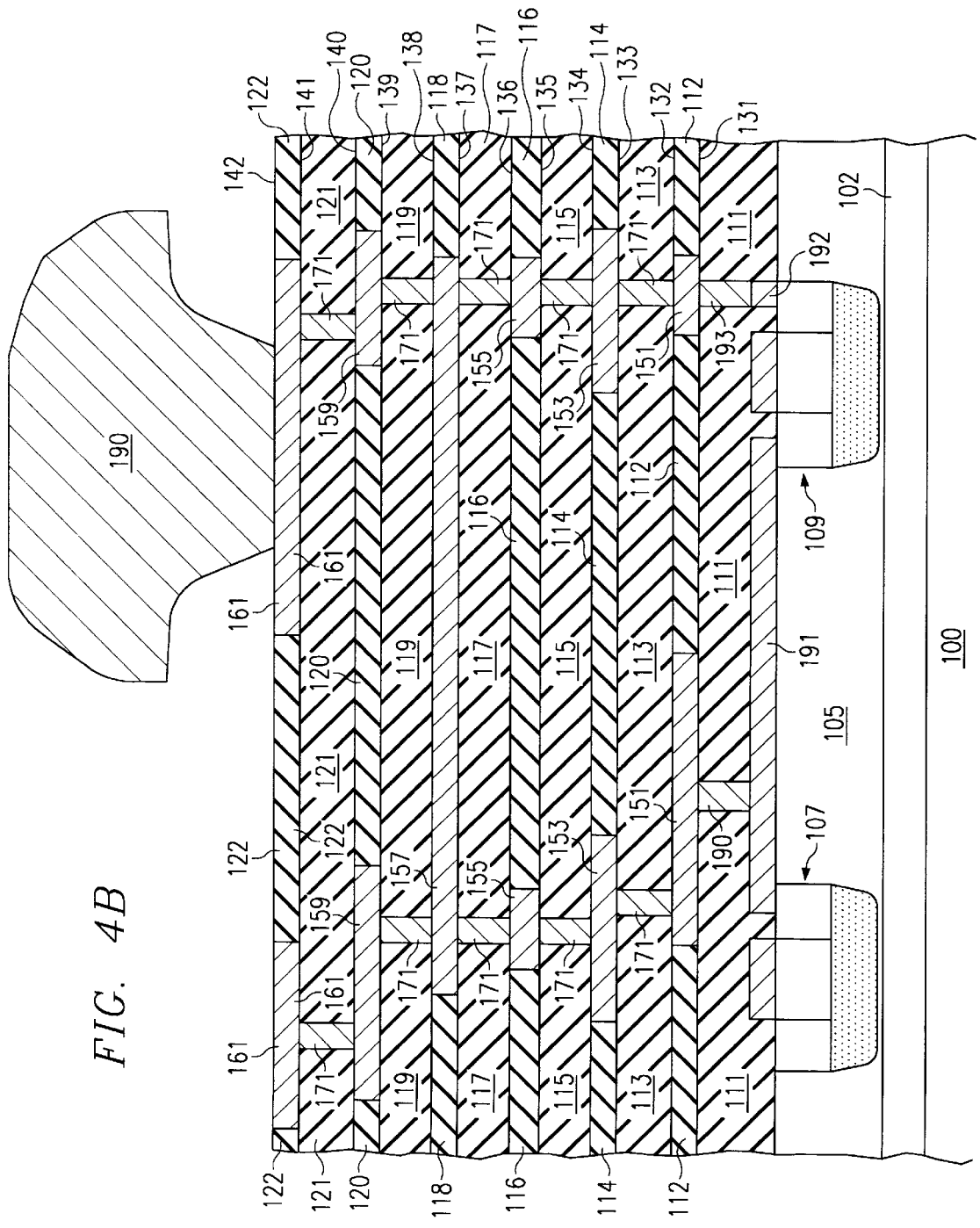
Figure 4C:
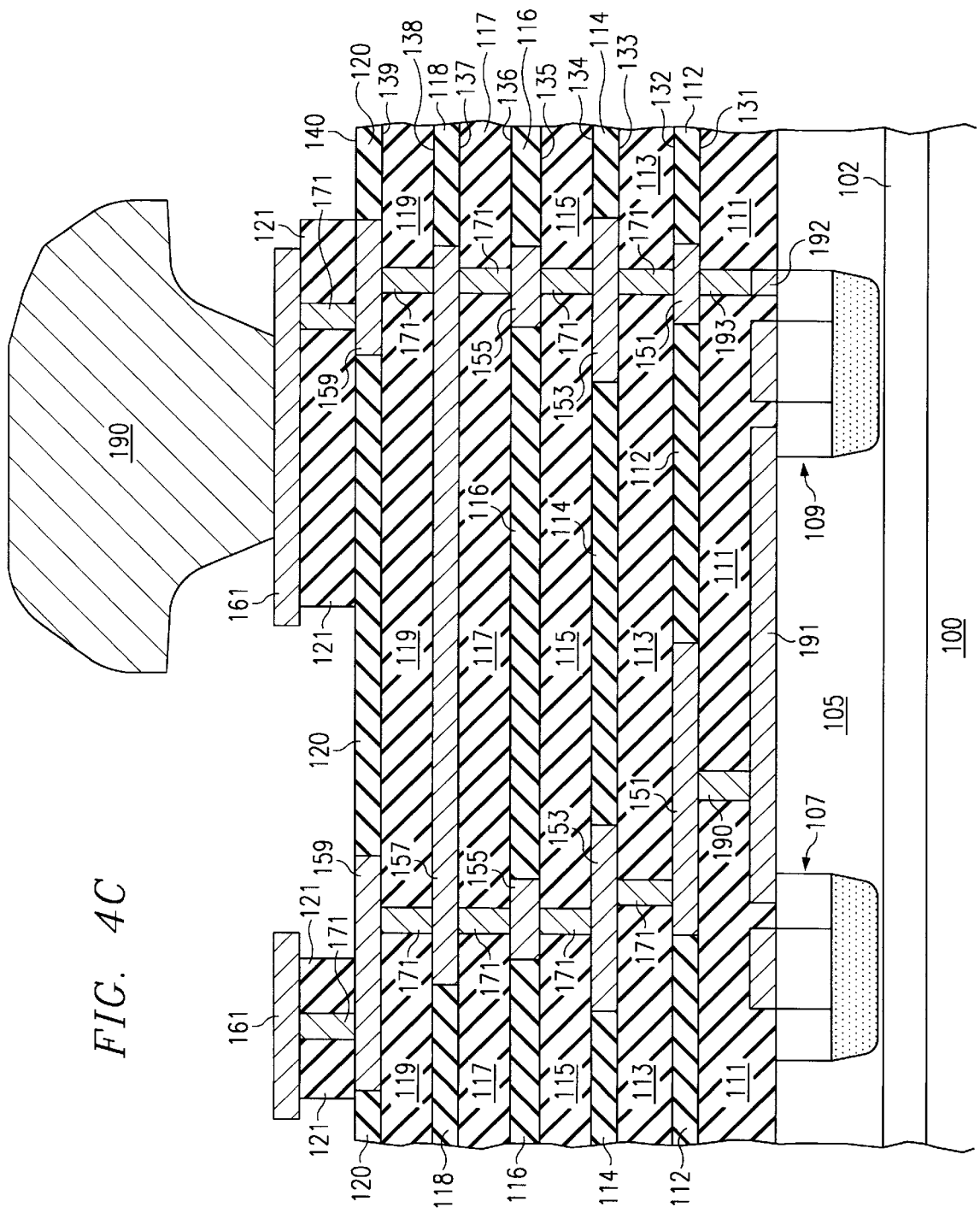
Figure 4D:
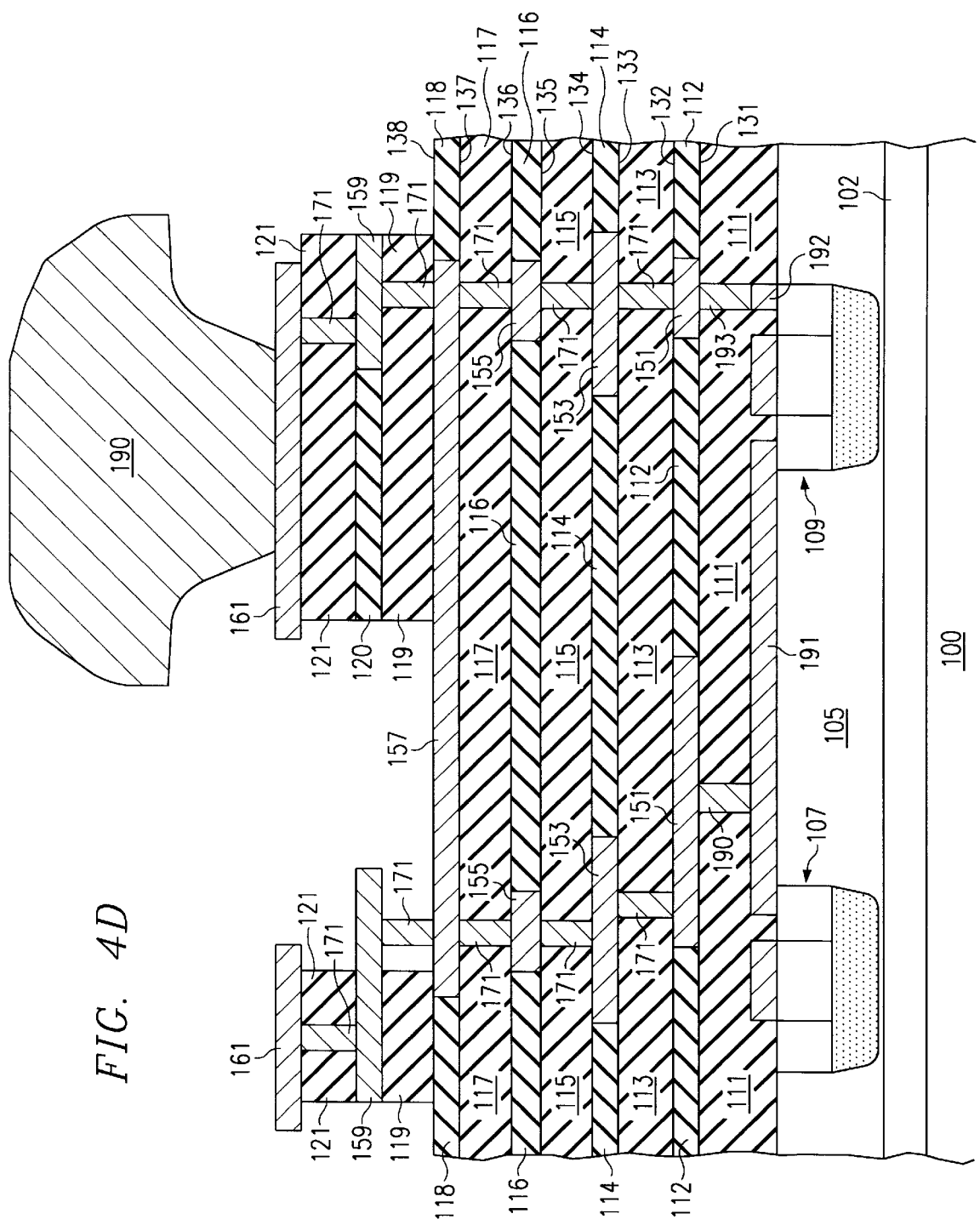
Figure 4E:
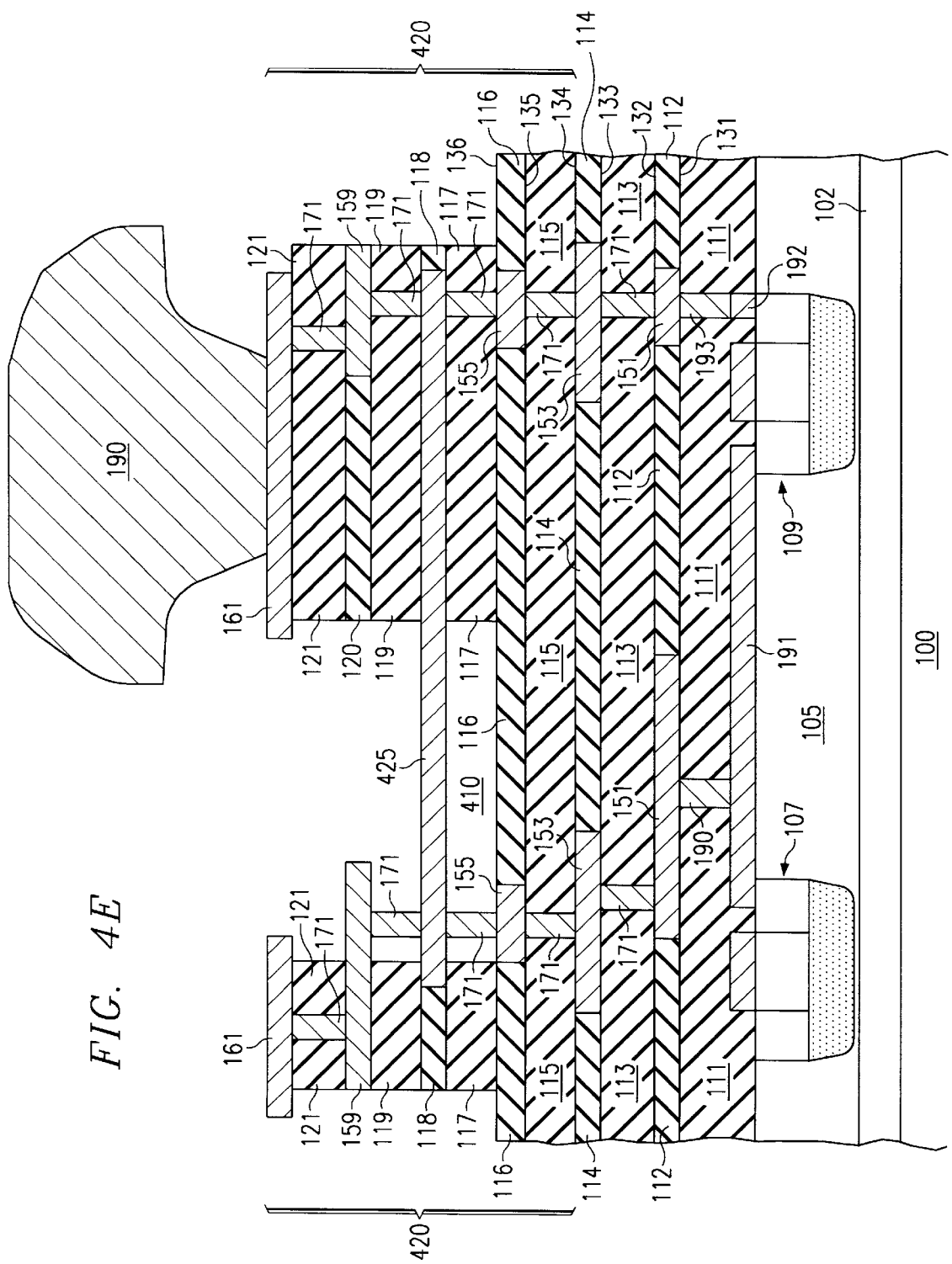

The process for post processing a CMOS wafer to produce air-gap dielectric interconnects will be illustrated with reference to FIG. 3, which shows a flow chart of a preferred embodiment of the present invention. After a CMOS wafer, such as wafer 100 depicted in FIG. 1, has been formed, the top polyimide layer 145 is etched out (step 310) using, for example, a plasma etch. FIG. 4A depicts CMOS wafer 100 after this step. Next, the dielectric layers 111, 112, 113, 114, 115, 116, 117, 118, 119, 120, 121, 122 and 123 are removed. In a preferred embodiment, the silicon oxide dielectric is removed (step 320) using a wet etching technique, such as a 49% HF etch or a $CHF_3/O_2$ reactive-ion etch ("RIE") for steep profiles. This etch removes the silicon oxide dielectric layers 111, 112, 113, 114, 115, 116, 117, 118, 119, 120, 121, 122 and 123 from the desired areas and leaves behind copper interconnects 151, 153, 155, 157, 159, and 161 supported by oxide islands 420. Silicon nitride layers 131, 132, 133, 134, 135, 136, 137, 138, 139, 140, 141, and 142 are used as an etch-stop such that the appropriate areas of the silicon oxide dielectric layers 111, 112, 113, 114, 115, 116, 117, 118, 119, 120, 121, 122 and 123 are removed layer by layer. This results in controlled removal of the silicon oxide debris. Thus, FIG. 4B depicts CMOS wafer 100 after the thick nitride layer 143 and outside silicon upside dielectric layer 123 have been removed. FIG. 4C depicts CMOS wafer 100 after selected portions of dielectric layers 121 and 122 have been removed. FIG. 4D depicts CMOS wafer 100 after selected portions of dielectric layers 120 and 119 have been removed. FIG. 4E depicts CMOS wafer 100 after selected portions of dielectric layers 118 and 117 have been removed.

The placement of the oxide layer is important in design because the island supports have to guarantee structural stability and be small in size. For example, the islands can be introduced at a pitch of 10 microns if the size of the oxide islands is 2 microns. This results in a dielectric constant reduction from the silicon oxide dielectric by a factor of 2.5, i.e., effective dielectric constant of 1.6. This reduction is much larger than methods introducing advanced low-k dielectrics that reduce the dielectric constant from 3.9 to 3.0.

If the copper cladding material is stable to air (step 330), then a separate low-k dielectric sheet cover can be introduced over the oxide islands 420 to protect the chip against dust particles or permit the use of underfills in a flip-chip process (step 360).

Figure 4F:
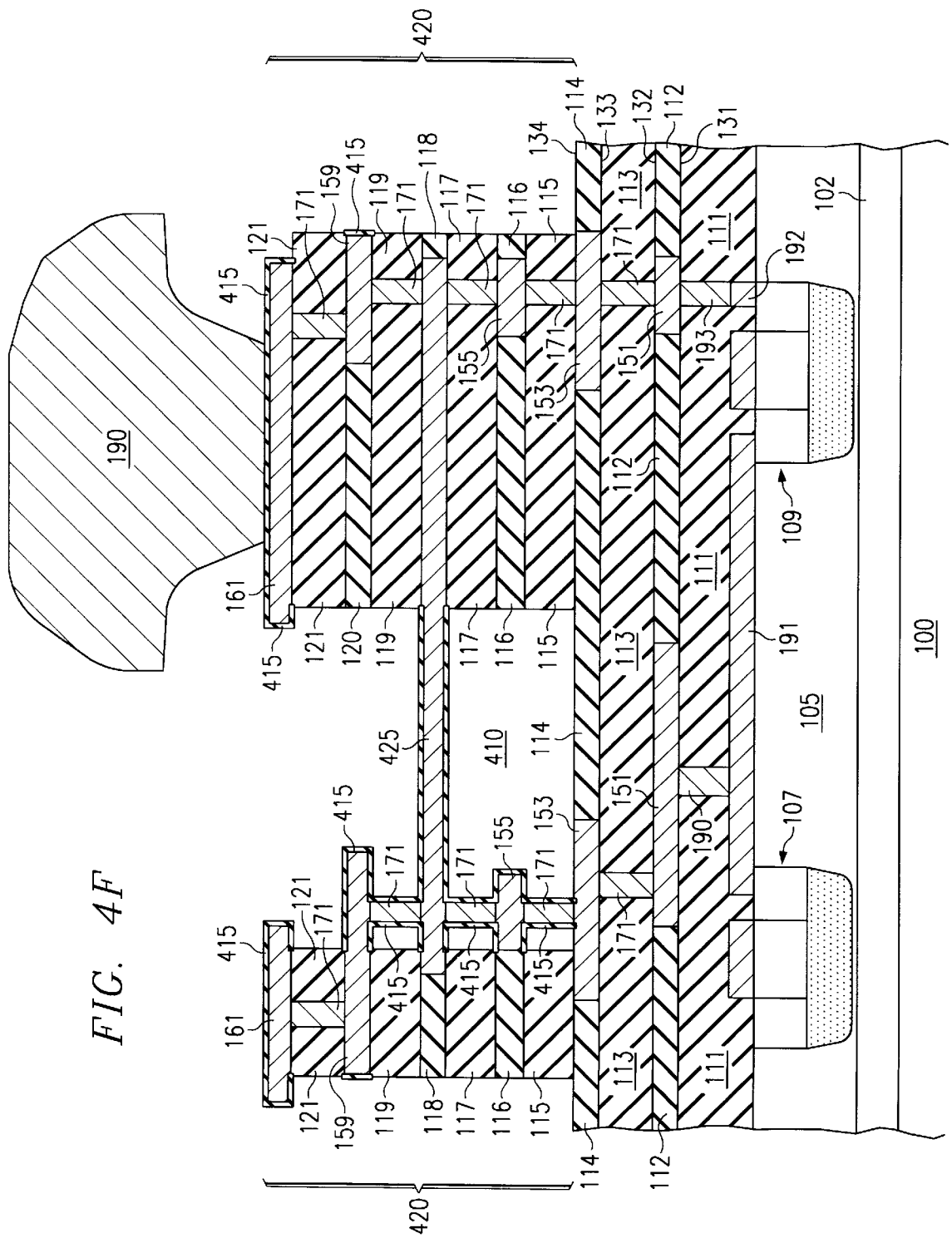

If the cladding material (copper cladding material in this example) is not stable to air, then the interconnects 151, 153, 155, 157, 159, and 161 can be etched (step 340), preferably using sulfuric acid, to produce a clean standardized surface. In the present example, etching the copper cladding material with 10% sulfuric acid plate will produce a clean standardized surface. This clean surface can then be coated with a thin layer of material that is stable in air (step 350). In the present example, a thin layer of nickel ("Ni") 415 has been applied to the clean standardized surfaces by electroplating. FIG. 4F depicts CMOS wafer 100 after the layer of nickel 415 has been applied. By introducing this thin layer of material that is stable in air, the long-term reliability of the exposed interconnects will be increased. Following this coating, the low-k dielectric sheet cover is mechanically introduced over the islands to protect the chip (step 360).

Figure 4G:
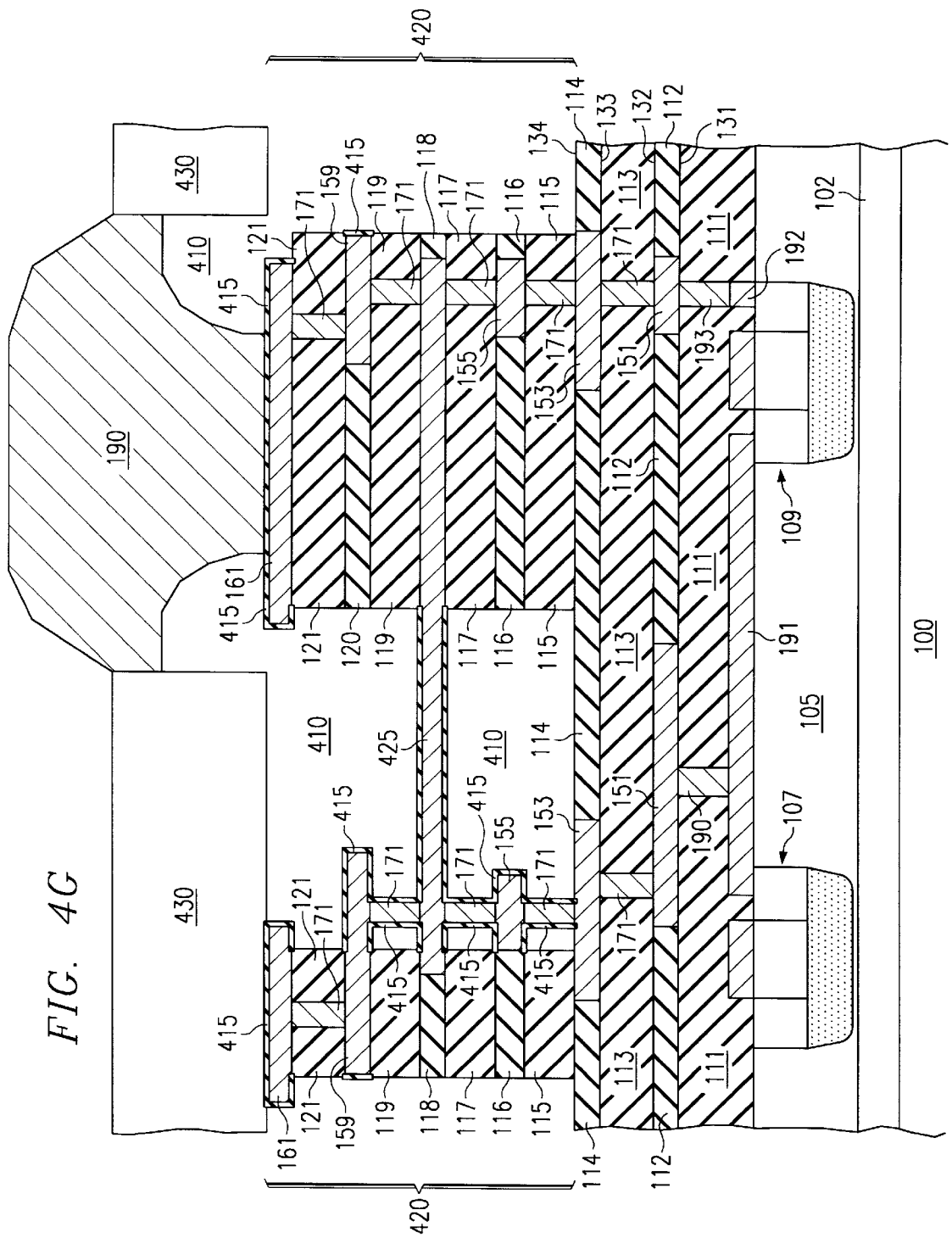

Wafer 100, after post-processing to produce air-gaps, is depicted in a cross-sectional view in FIG. 4G. The silicon oxide dielectric has been replaced, in selected areas, by air 410. Cladded copper interconnects 151, 153, 155, 157, 159, and 161 have been coated with a nickel plating 415 wherever the interconnects 151, 153, 155, 157, 159, and 161 would be exposed to the air 410. Other materials which could be used in place of nickel plating 415 include but are not limited to cobalt ("Co") or platinum ("Pt") or any refractory material such as Tungsten ("W"), Niobium ("Nb") or Tantalum ("Ta"). Selected portions of the dielectric layers 111, 112, 113, 114, 115, 116, 117, 118, 119, 120, 121, 122 and 123 remain as dielectric supports 420 to support the interconnect islands 425. A low-k dielectric cover 430 lies over the islands to cover and protect wafer 100.

Figure 5:
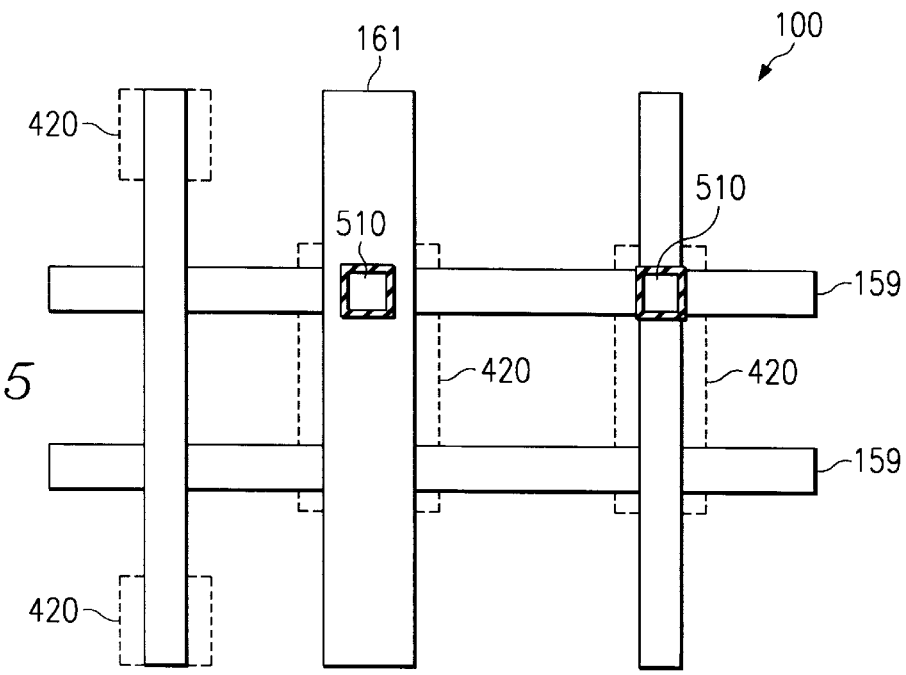
FIG. 5 depicts a mask view of a chip illustrating the placement of oxide supports.

FIG. 5 depicts a mask view of wafer 100. By reference to FIG. 5, the orientation of the dielectric supports 420 in relation to the interconnects can more readily be appreciated and understood. For clarity and illustration purposes, only certain aspects of wafer 100 are depicted in this view. Interconnects 159 and 161 are shown with dielectric supports 420. Via connections 510 are also shown. The effective dielectric constant is determined by the pitch of the support structures 420. Speed-critical paths may be selectively tailored.

Although the present invention has been illustrated primarily with reference to an SOI CMOS wafer, the present invention may be applied to various semiconductor devices on other types of substrates containing interconnects as will be apparent to one skilled in the art. Such devices include but are not limited to bipolar devices, bulk transistor devices, and memory chips such as DRAMs. The processes of the present invention also may be applied to other substrates other than SOI substrates, such as, for example, silicon substrates, silicon on sapphire (SOS) substrates, and gallium arsenide substrates. Furthermore, the present invention has been illustrated by way of example with reference to silicon oxide dielectrics and silicon nitride etch stop layers. However, the present invention is applicable to other dielectrics and etch stops as will be readily apparent to one skilled in the art. Additionally, materials other than copper may be used as the interconnect material. The only requirement for the interconnect material being that it be conductive to electricity. Also, materials other than nickel may be used as the coating for the cladding material. All of these modifications will be readily apparent to one skilled in the art and are, accordingly, part of the scope of the present invention.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of fabricating an integrated circuit having air-gap dielectric interconnects, comprising the steps of:
    forming a partially fabricated integrated circuit comprising a top layer, interconnect structures having a cladding layer, dielectric layers separating some parts of said interconnect structures from each other and an etch stop layer resistant to a first etchant;
    etching said top layer of said integrated circuit with a second etchant;
    etching said dielectric layers with said first etchant until said etch stop layer is reached to expose portions of said interconnect structures to create interconnect islands; and
    mechanically introducing a cover over said exposed interconnect islands to protect said exposed interconnect islands.

2. The method of claim 1 further comprising the steps of:
    etching said cladding layer of said interconnect islands with a third etchant to remove said cladding layer; and
    forming a thin layer of oxide resistant material on the exposed surfaces of said interconnect islands.

3. The method of claim 1 wherein said interconnect structures are a metallic material.

4. The method of claim 1, wherein said interconnect structures are metal.

5. The method of claim 1, wherein said interconnect structures are copper.

6. The method of claim 1, wherein said first etchant is a wet etchant.

7. The method of claim 1, wherein said first etchant is hydrogen fluoride.

8. The method of claim 1, wherein said first etchant is a reactive-ion etchant.

9. The method of claim 1, wherein said first etchant is $CHF_3/O_2$ reactive-ion etchant.

10. The method of claim 1, wherein said etching the top layer is performed by plasma etching.

11. The method of claim 1, wherein said dielectric layers are silicon oxide.

12. The method of claim 1, wherein said dielectric layers are an oxide.

13. The method of claim 1, wherein said etch stop is silicon nitride.

14. The method of claim 1, wherein said partially fabricated integrated circuit is planarized prior to said etching steps.

15. The method of claim 2, wherein said third etchant is sulfuric acid.

16. The method of claim 2, wherein said oxide resistant material is nickel.

* * * * *